United States Patent [19]

Kushida et al.

[11] Patent Number: 4,677,336

[45] Date of Patent: Jun. 30, 1987

[54] PIEZOELECTRIC TRANSDUCER AND PROCESS FOR ITS PRODUCTION

[75] Inventors: Keiko Kushida, Kunitachi; Hiroshi Takeuchi, Matsudo, both of Japan

[73] Assignee: Hitachi, Ltd., Tokyo, Japan

[21] Appl. No.: 824,728

[22] Filed: Jan. 31, 1986

[30] Foreign Application Priority Data

Feb. 4, 1985 [JP] Japan .................................. 60-19446

[51] Int. Cl.⁴ ........................................... H01L 41/08
[52] U.S. Cl. .................................... 310/334; 310/311; 310/358; 310/365
[58] Field of Search ................ 310/311, 320, 334–336, 310/348, 365, 357, 358, 360, 313 R

[56] References Cited

U.S. PATENT DOCUMENTS

| | | | |
|---|---|---|---|
| 3,469,120 | 9/1969 | Nagao et al. ......................... | 310/334 |
| 3,872,332 | 3/1975 | Butter ............................. | 310/334 X |
| 3,891,869 | 6/1975 | Scarpa ............................. | 310/334 X |
| 3,942,139 | 3/1976 | Cooper et al. ................... | 310/334 X |
| 4,357,553 | 11/1982 | Minagawa et al. ............. | 310/313 B |
| 4,480,209 | 10/1984 | Okamoto et al. ............... | 310/313 B |

*Primary Examiner*—Mark O. Budd
*Attorney, Agent, or Firm*—Antonelli, Terry & Wands

[57] ABSTRACT

A piezoelectric transducer made from a piezoelectric thin film based on lead titanate ($PbTiO_3$): comprising a substrate having sawtooth profile gratings formed on the surface by anisotropic etching; a platinum layer formed by graphoepitaxy method on the substance; a piezoelectric thin film formed on the platinum layer; and an upper electrode layer. Although platinum shows (111) orientation, a (100)-oriented platinum film can be obtained by depositing platinum on said substrate having the gratings by graphoepitaxy. A c-axis-oriented piezoelectric film of excellent piezoelectricity can be formed on this platinum film.

7 Claims, 12 Drawing Figures

PIEZOELECTRIC TRANSDUCER AND PROCESS FOR ITS PRODUCTION

BACKGROUND OF THE INVENTION

This invention relates to a piezoelectric transducer and a process for producing the same and more particularly relates to a piezoelectric transducer made from a thin film of lead titanate ($PbTiO_3$) of excellent piezoelectricity and a process for producing the same.

It is heretofore known that lead titanate has a large axial ratio and spontaneous polarization Ps in the ferroelectric phase (tetragonal system).

It is generally believed that the piezoelectricity of a ferroelectric crystal is proportional to the magnitude of spontaneous polarization Ps. It was reported that in an experiment where a fine single crystal of lead titanate was used, the ferroelectric crystal actually had a large piezoelectricity.

However, because it is difficult in reality to produce lead titanate in the form of a single crystal of a practical size, lead titanate is used in the form of a ceramic at present. However, when lead titanate is formed into a ceramic, c-axes of the $PbTiO_3$ crystallites are randomly oriented and therefore the merit of lead titanate that the piezoelectricity in the c-axis direction is large can not be fully utilized.

On the other hand, a piezoelectric transducer having a structure in which a metal film as an electrode is formed on a substrate and a piezoelectric thin film is deposited on it is also known. However, even in such piezoelectric thin films, only those made from limited piezoelectric materials can be used in actual piezoelectric transducers, because no satisfactory piezoelectric property can be attained by a polycrystalline film in which axes of the crystallites along which they show strong piezoelectricity are random. For example, a ZnO film deposited on a gold film by radio-frequency sputtering is uniformly oriented and shows piezoelectricity in the direction of the thickness of the film, so that it is used for a piezoelectric transducer. However, when a perovskite-type piezoelectric material is formed into a thin film by usual film forming techniques, the formed thin film is non-oriented. Therefore, it has been difficult to produce practical thin-film piezoelectric transducers in which the large piezoelectricity are fully utilized. A particular example (Japanese Patent Laid-Open No. 223230/1984) shows that a (100)-oriented platinum (Pt) film as an electrode is placed on a magnesium oxide (MgO) single crystal substrate and a c-axis-oriented thin film of lead titanate is then formed on the electrode.

In this process, however, it is only possible to use very limited kinds of single crystal substrates that have a lattice constant nearly equal to that of a piezoelectric substance.

SUMMARY OF THE INVENTION

It is an object of this invention to afford a film of excellent c-axis orientation from a perovskite-type piezoelectric material and to produce a piezoelectric thin-film transducer of excellent piezoelectricity.

It is another object of this invention to provide a piezoelectric thin-film transducer by using a material of an arbitrary lattice constant as a material for a substrate.

It is still another object of this invention to provide a piezoelectric thin film which, together with an electric circuit, can form a monolithic device by using a semiconductor substrate.

The feature of this invention consists in a piezoelectric transducer having a substrate having sawtooth profile gratings on the main surface; a first metal layer formed on the main surface of said substrate and comprising a face-centered cubic metal material having (111) orientation on smooth surface; a piezoelectric film formed on said metal layer and comprising a perovskite-type piezoelectric material; and a second metal layer formed on said piezoelectric film.

Exemplary of a material for said first metal layer is platinum, and a (100)-oriented film of this metal is formed by depositing Pt on the main surface of the substrate having sawtooth profile gratings by graphoepitaxiy. Exemplary of the piezoelectric material formed on the metal film is $PbTiO_3$ or its mixture with small amounts of other components. This material can form an excellent c-axis oriented thin film by depositing it on said metal layer, so that a piezoelectric transducer of excellent piezoelectricity can be obtained.

The above substrate having the sawtooth profile gratings can be obtained by forming a striped $SiO_2$ mask on the surface of, typically, a (100) silicon substrate and subjecting it to anisotropic etching. It can be obtained also be applying a striped mask onto an amorphous substrate and subjecting it to ion milling from two directions.

DESCRIPTION OF PREFERRED EMBODIMENTS

Figure 1A:
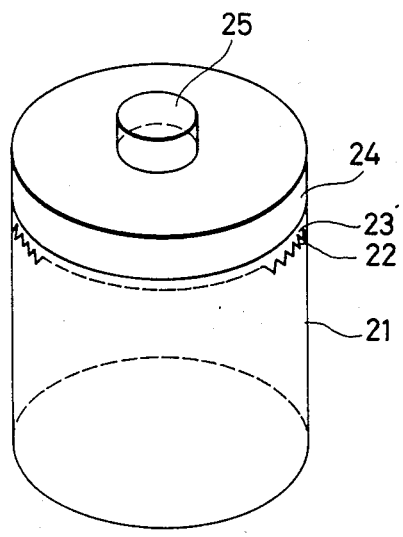
Figure 1B:
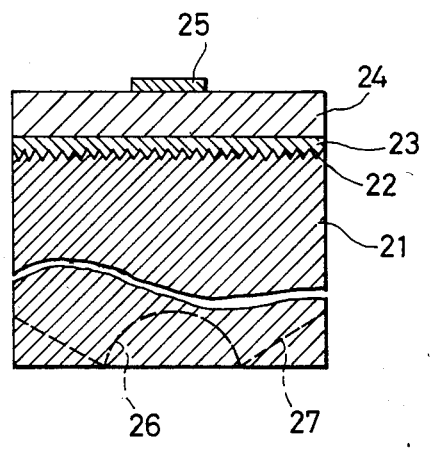

FIGS. 1A and 1B are the appearance and cross-sectional view of a piezoelectric transducer of a first example of this invention, respectively.

In these figures, 21 is a substrate of a silicon (Si) material whose main surface 22 is grated to have a sawtooth profile, 24 is a lower electrode layer comprising platinum, 24 is a piezoelectric thin film based on lead titanate, and 25 is an upper electrode layer.

Figure 2A:
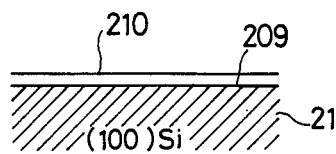
Figure 2D:
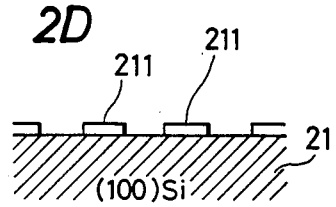
Figure 2B:
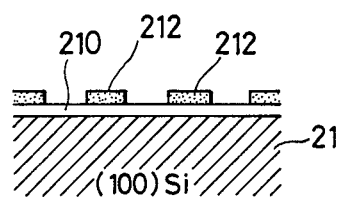
Figure 2E:
Figure 2C:
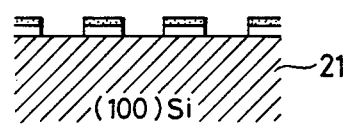
Figure 2F:
Figure 3:
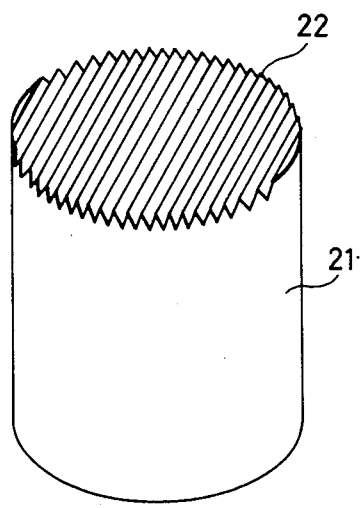
Figure 4:
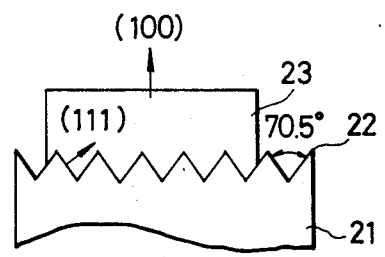

The silicon substrate 21 is made of a 10 mm $\phi \times 10$ mm silicon single crystal whose top and bottom surfaces are (100) planes. FIGS. 2A to 2E illustrate procedures for grating the silicon substrate 21. First, as shown in FIG. 2A, a $SiO_2$ layer 210 is formed on the main surface 209 of the substrate 21 by thermal oxidation. Next, a photoresist film is formed on the $SiO_2$ layer and exposed and developed to obtain a resist pattern 212 having a 0.3 μm pitch as shown in FIG. 2B. Next, the $SiO_2$ layer is etched by $CHF_3$ gas reactive-ion etching to bring the layer 210 to a state as shown in FIG. 2C. By removing the resist film, a state shown in FIG. 2D is brought about. This is subjected to anisotropic etching with a 20% aqueous KOH solution saturated with isopropyl alcohol by using the striped $SiO_2$ film 211 as a mask. By etching at 75° C. for 15 sec, sawtooth profile gratings having an angle of intersection of slope of 70.5° as shown in FIG. 2E are formed. Finally, as shown in FIG. 2F, a thin $SiO_2$ layer 214 is formed on the surface having the gratings by thermal oxidation. FIG. 3 is a perspective view of the silicon substrate 21 having the gratings thus formed. This substrate 21 is heated to 200° C. and platinum is vapor-deposited to form a lower electrode layer 23 on it. This is further annealed at 800° C. for 2 hours to improve the orientation of the platinum layer.

Since platinum shows strong (111) orientation, the layer 23 formed on the main surface having the gratings is a (100)-oriented film.

This is shown schematically in FIG. 3. The vapor deposition and annealing have effected graphoepitaxy to convert the layer 23 formed on the surface 22 into a (100)-oriented layer. When the temperature of the substrate during the vapor deposition is elevated, a (100)-oriented platinum layer can be directly obtained without resort to any annealing step. In this example, the amount of deposited platinum sufficient to fill the grooves of the gratings and to obtain a platinum film which is (100)-oriented up to its surface was equal to that which would be used to form a 3000 Å-thick platinum film on a flat surface by vapor deposition.

Next, a thin film based on lead titanate is formed as a piezoelectric layer on the lower electrode layer 23 by radio-frequency magnetron sputtering. Here, minor components which are added to $PbTiO_3$ for improving piezoelectricity include, for example, zirconium (Zr) and magnesium (Mg). Preferable sputtering conditions include a substrate temperature of 550° C., an $Ar-O_2$ gas (90%-10%) pressure of 3 Pa, and a sputtering time of 10 hours. The thickness of a film formed under these conditions is about 3 μm.

The piezoelectric thin film thus prepared was evaluated by X-ray diffractometry. It was revealed that this film had a strong (00l) diffraction peak and a weak (h00) diffraction peak and was a substantially c-axis-oriented thin film. Here, l is 1, 2 or 3, and h is 1 or 3.

Subsequently, chromium (Cr) and gold (Au) were vapor-deposited through a 5 mm φ mask on the piezoelectric thin film 4 to form an upper electrode 5.

Thereafter, while the temperature of the sample was being kept at 200° C., the sample was poled by applying a direct-current voltage of 100 kV/cm for about 20 min between the electrodes.

The measurement of the sensitivity of the present invention piezoelectric transducer produced by the above process was made according to a pulse-echo method. Namely, ultrasonic waves were generated by applying burst wave signal between the electrodes 23 and 25, and the intensity of the echo reflected by the other end of the pillar substrate was measured in the frequency range of from 0.1 to 1.2 GHz. From the obtained frequency characteristics, the electromechanical coupling factor was determined to have a value of 0.62. This value was larger than that ($\simeq 0.5$) of a ceramic based on $PbTiO_3$, so that the piezoelectric transducer in this example fully exhibited an effect resulting from the formation of the c-axis-oriented piezoelectric thin film.

While a substrate having 0.3 μm pitch gratings is used in the above example, gratings having a pitch of 0.6 μm or below are desirable. When gratings having a pitch finer than 0.3 μm are applied to a substrate, the graphoepitaxy of a platinum film can be facilitated. When the temperature condition of sputtering for forming the film 24 was changed to 200° C., the piezoelectric thin film 24 had no clear diffraction line and was amorphous. Therefore, it was evaluated by X-ray diffractometry after it had been annealed at 700° C. for 8 hours. It was revealed that the film had a strong (00l) diffraction line and a weak (h00) diffraction line.

This result demonstrates that the c-axis-oriented piezoelectric thin film 24 can be obtained also by a process comprising forming an amorphous piezoelectric thin film on the (100)-oriented platinum electrode layer 23 and therefter annealing said amorphous layer under certain conditions.

An upper electrode layer 25 was formed in the same way on the thin film of lead titanate formed by this process, and this sample was poled. The electromechanical coupling factor of this sample was measured by a pulse-echo method and determined to have a value of 0.58.

Figure 5A:
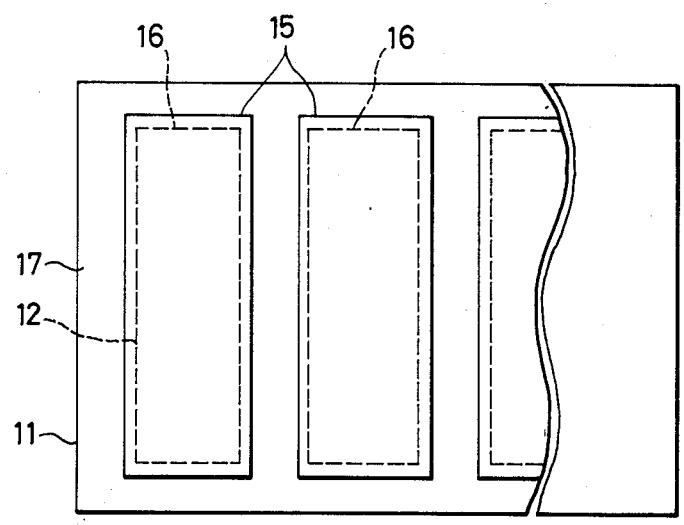
Figure 5B:
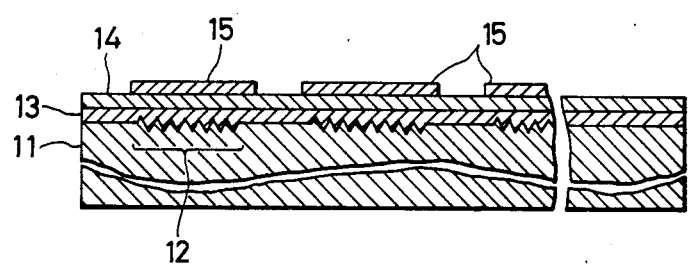

FIGS. 5A and 5B are, respectively, plan and sectional views of an array piezoelectric transducer produced in the same manner as in the example shown in FIGS. 1 to 4.

A silicon substrate 11 has gratings as mentioned above on only that regions 16 of the main surface which coincide with transducer elements and (100) planes on the other regions are left as they are. On this substrate are formed a lower electrode 13 which serves as an electrode common to all of the electrodes of the transducer elements and a piezoelectric film 14 based on $PbTiO_3$ in this order. Further, on the part coinciding with each region 16 is placed an electrode 15 which serves as an electrode of each transducer element.

In this structure, the lower electrode 13 is a (100)-oriented film in the region 16 but it is a (111)-oriented film in the region 17. Therefore, the thin film 14 of lead titanate is c-axis-oriented on the platinum film in the region 16, whereas the thin film 14 of lead titanate on the platinum film in the region 17 is a non-oriented film.

When the piezoelectric film 14 thus formed is poled by using the electrode 13 and the electrodes 15, only the region 16 can be piezoelectrically activated. In this way, by selectively applying gratings to only the regions which coincide with the transducer element, the orientation of the piezoelectric film can be controlled and, therefore, an array piezoelectric transducer excellent in signal separation among elements can be obtained.

In the examples above shown, a silicon crystal is used as a substrate. Therefore, it is also possible to realize a monolithic device in which driving circuits or signal receivers are formed on the same substrate.

It is also possible to use the substrate 21 as an acoustic lens by forming a hemispherical hole 26 at the bottom of the substrate 21 as shown in FIG. 1B by a broken line. When the substrate 21 is used as an acoustic lens, it is preferable that the surface outside of the hemispherical hole 26 is tapered as shown by 27.

The silicon crystal used in the above examples may be replaced by other anisotropically etchable materials, for example. GaAs or InP crystals. These materials can be used as substrates by applying thereto sawtooth profile gratings in the same manner as above.

Further, processes for obtaining a substrate having gratings are not limited to the above mentioned. For example, it is possible to obtain a substrate having gratings shown in FIG. 2 by forming a striped mask on the surface of quartz glass, followed by ion milling from two directions.

On the other hand, examples of the materials for the lower electrode layer include a face-centered cubic structure metal showing (111) orientation on smooth surface, for example, gold (Au), aluminum (Al), palladium (Pd), irridium (Ir) on rhodium (Rh) as well as platinum (Pt). However, it is preferable to select a metal material having a lattice constant closest to that of a piezoelectric material which is to be grown and oriented.

What is claimed is:

1. A piezoelectric transducer comprising a substrate having sawtooth profile gratings on the main surface; a first metal layer comprising a face-centered cubic metal material showing (111) orientation on smooth surface; a piezoelectric film formed on said first metal layer and comprising a perovskite-type piezoelectric material; and a second metal layer formed on said piezoelectric film.

2. A piezoelectric transducer according to claim 1, wherein the gratings on the main surface of said substrate have an angle of intersection of slope of 70.5°.

3. A piezoelectric transducer according to claim 1, wherein said gratings have a pitch of 0.6 μm or below.

4. A piezoelectric transducer according to claim 1, wherein said first metal layer comprises platinum (Pt).

5. A piezoelectric transducer according to claim 1, wherein said piezoelectric film comprises a piezoelectric material based on lead titanate.

6. A piezoelectric transducer according to claim 1, wherein said substrate comprises a silicon single crystal.

7. An array piezoelectric transducer in which a plurality of transducer elements are set in array, comprising a substrate having sawtooth profile gratings on that specified regions of the main surface which coincide with the transducer elements; a first metal layer formed on the main surface of said substrate, comprising a face-centered cubic metal showing (111) orientation on smooth surface, and serving as an electrode common to the transducer elements of said transducer; a piezoelectric film formed on said first metal layer and comprising a perovskite-type piezoelectric material; and a second metal layer formed on said specified regions on said piezoelectric film wherein the part in each of the regions serves as an electrode for each of the elements.

* * * * *